United States Patent
Farooq et al.

(10) Patent No.: US 7,923,836 B2
(45) Date of Patent: Apr. 12, 2011

(54) BLM STRUCTURE FOR APPLICATION TO COPPER PAD

(75) Inventors: Mukta G. Farooq, Hopewell Junction, NY (US); Tien-Jen Cheng, Bedford, NY (US); Roger A. Quon, Rhinebeck, NY (US)

(73) Assignee: International Business Machines Corporation, Armonk, NY (US)

( * ) Notice: Subject to any disclaimer, the term of this patent is extended or adjusted under 35 U.S.C. 154(b) by 576 days.

(21) Appl. No.: 11/459,119

(22) Filed: Jul. 21, 2006

(65) Prior Publication Data

US 2008/0017984 A1    Jan. 24, 2008

(51) Int. Cl.
*H01L 23/48* (2006.01)

(52) U.S. Cl. ........ 257/738; 257/737; 257/673; 257/761; 257/762; 257/763; 257/780; 257/779; 257/764; 257/E21.508; 257/E21.509; 257/E21.592

(58) Field of Classification Search .......... 257/737, 257/738, 734, 673, 761, 762, 763, 764, 779, 257/780, E21.508, E21.509, E21.592
See application file for complete search history.

(56) References Cited

U.S. PATENT DOCUMENTS

| 4,252,867 | A  | * | 2/1981  | Nemoto et al. ............. 428/660 |
| 6,570,251 | B1 |   | 5/2003  | Akram et al. |
| 6,960,828 | B2 | * | 11/2005 | Nair et al. .................. 257/734 |
| 7,095,121 | B2 | * | 8/2006  | Tellkamp .................... 257/781 |
| 7,282,432 | B2 | * | 10/2007 | Tago et al. .................. 438/613 |
| 2002/0064935 | A1 | * | 5/2002  | Honda ........................ 438/622 |
| 2002/0096764 | A1 | * | 7/2002  | Huang ........................ 257/737 |
| 2002/0185030 | A1 | * | 12/2002 | Reese et al. ................. 102/476 |
| 2004/0164421 | A1 |   | 8/2004  | Tellkamp |
| 2005/0118437 | A1 | * | 6/2005  | Cheng et al. ................ 428/458 |
| 2006/0037672 | A1 | * | 2/2006  | Love et al. .................. 148/402 |
| 2007/0069346 | A1 | * | 3/2007  | Lin et al. ..................... 257/673 |
| 2007/0235878 | A1 | * | 10/2007 | Lin et al. ..................... 257/773 |

OTHER PUBLICATIONS

S. J. Hong et al., "Under Bump Metallization Development for Eutectic Pb-Sn Solders," Mat. Res. Symp. Proc., vol. 515 (1998), pp. 73-77.

T.M. Korhonen et al., "Flip-Chip Metallurgies for Lead-Free Solders," Mat. Res. Symp. Proc., vol. 515 (1998), pp. 79-83.

* cited by examiner

*Primary Examiner* — Wael M Fahmy
*Assistant Examiner* — Marc Armand
(74) *Attorney, Agent, or Firm* — Katherine S. Brown; Lisa U. Jaklitsch; Daryl K. Neff

(57) ABSTRACT

A microelectronic element and a related method for fabricating such is provided. The microelectronic element comprises a contact pad overlying a major surface of a substrate. The contact pad has a composition including copper at a contact surface. A passivation layer is also provided overlying the major surface of the substrate. The passivation layer overlies the contact pad such that it exposes at least a portion of the contact surface. A plurality of metal layers arranged in a stack overlie the contact surface and at least a portion of the passivation layer. The stack includes multiple layers, which can have different thicknesses and different metals, with the lowest layer including titanium (Ti) and nickel (Ni) in contact with the contact surface.

15 Claims, 2 Drawing Sheets

BLM STRUCTURE FOR APPLICATION TO COPPER PAD

BACKGROUND OF THE INVENTION

The present invention relates to microelectronics, especially semiconductor chips and more particularly to structures for forming metallurgical interconnections of chips.

The external conductive interconnection of chips, e.g., micro-scale devices such as semiconductor integrated circuits (ICs) and other devices such as micro-electromechanical devices ("MEMs"), has long provided challenges in the design and methods of manufacturing them. Typically, the conductive contacts of chips are externally interconnected to other elements such as to package-level interconnects via metallurgical bonds. Metallurgical bonds are formed by heating a fusible material such as solder, tin or a eutectic composition to a temperature at which that material fuses to a metal at a surface of the chip and at a surface of another element with which the chip is in contact.

High performance microelectronic devices frequently utilize solder bumps to form interconnections between external pads of chips and other elements, particularly corresponding contacts of a package element. An example of the use of solder bumps to provide such interconnections is known as "controlled collapse chip connection" or "C4" technology. C4 technology is a specific way of forming flip-chip interconnections in which contact pads of chips are interconnected through solder bumps to corresponding contact pads of a package or circuit element having wiring traces thereon. In C4 technology, solder bumps are typically joined to a chip through a particular type of under bump metallization ("UBM") known as "ball limiting metallurgy" ("BLM"). The BLM typically includes a layered stack of metals and primarily functions to promote adhesion between metals, e.g., component metals of solder and those of the pads interconnected thereby, while restricting diffusion of the metals to within acceptable limits.

The use of copper has increased in recent years for forming conductive interconnections between individual devices and circuits of chips, e.g., during "back-end-of-line" ("BEOL") manufacturing of chips. Copper interconnect technology for such BEOL interconnections has become well-developed. However, the technology for interconnecting external pads of a chip has not kept pace with these developments. Corresponding development is needed in the BLM structure. Heretofore, BLMs were designed for contacting external aluminum pads of a chip. In places where C4 interconnects are provided to chips with copper pads, an aluminum pad has been required as an intermediate layer between the copper pads and the BLM. A BLM structure and processing method is needed for providing a BLM structure by which the intermediate aluminum pad can be eliminated. In this way, reductions in process complexity can be achieved.

SUMMARY OF THE INVENTION

A microelectronic element and a related method for fabricating such element is provided. The microelectronic element comprises a contact pad overlying a major surface of a substrate. The contact pad has a composition including copper at a contact surface. A passivation layer is also provided overlying the major surface of the substrate. The passivation layer overlies the contact pad such that it exposes at least a portion of the contact surface. A plurality of metal layers arranged in a stack overlie the contact surface and at least a portion of the passivation layer. The stack includes multiple layers, which can have different thicknesses and different metals, with the lowest layer including titanium (Ti) and nickel (Ni) in contact with the contact surface.

DETAILED DESCRIPTION

Figure 1:
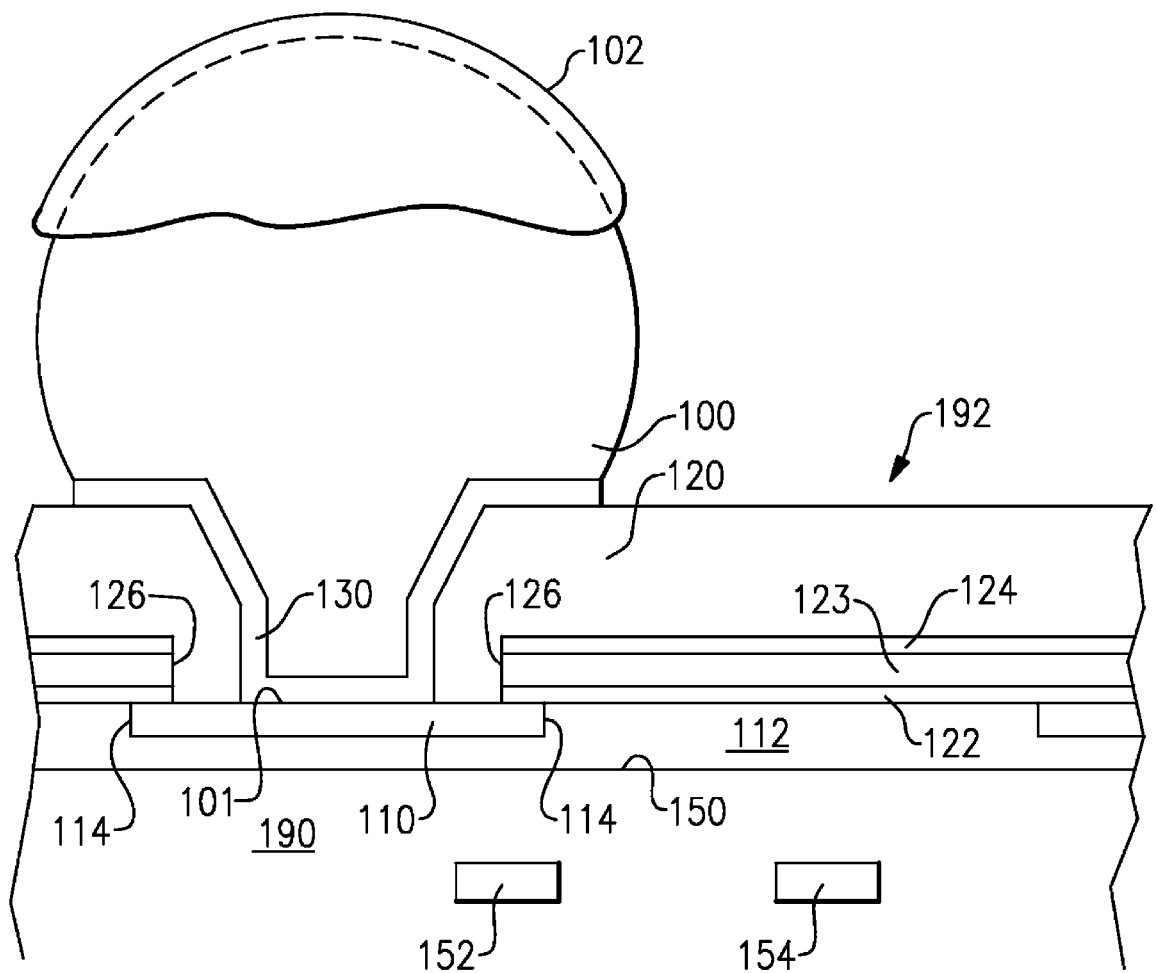
FIG. 1 is a partial sectional view of a microelectronic element in accordance with an embodiment of the invention, the microelectronic element including a ball limiting metallurgy ("BLM") under bump structure and a solder bump attached to the BLM structure.

FIG. 1 is a partial sectional view of a substrate 192 such as a chip or wafer, having a bump 100 protruding above a passivation layer 120 for externally interconnecting the chip to a contact pad of another element (not shown) such as a package element, another chip, a wiring substrate or other such element. The bump 100 includes a fusible metal such as solder, tin or a eutectic composition, for example, and may include a solid or flexible core at a center of the bump. Optionally, the bump 100 may include an additional cap layer, e.g., a tin cap 102.

As illustrated in FIG. 1, the bump is joined to a BLM 130, which in turn, overlies the dielectric passivation layer 120. The passivation layer 120 itself overlies a major surface 150 of the substrate 190. The substrate 190 preferably includes a plurality of microelectronic devices 152 and/or micro-electromechanical devices 154 underlying the major surface 150.

As shown in FIG. 1, the conductive bump is joined to the substrate by a layered stack of metal layers, preferably in form of a BLM 130. The BLM 130 overlies and conductively contacts a contact pad 110 of the substrate, the contact pad having a composition including copper. The contact pad has a surface 101 in contact with the BLM, with copper preferably being exposed at that surface 101. As further shown in FIG. 1, the passivation layer 120 overlies the contact pad 110 and exposes a portion of the contact pad where the BLM is joined thereto.

Other elements illustrated in FIG. 1 include a dielectric layer ("ILD") 112 overlying the major surface 150 of the substrate, in which the copper-containing contact pad 110 is disposed. A cap dielectric layer 122, which may consist essentially, for example, of a material such as silicon nitride, overlies the dielectric layer 112 and exposes a portion of the contact pad 110. An additional dielectric layer such as additional inorganic dielectric layer 123, preferably including silicon dioxide and yet another inorganic dielectric layer 124 including, for example, silicon nitride, overlie the dielectric layer 112 and copper contact pad. As illustrated in FIG. 1, an opening extends through the cap dielectric layer 122 and inorganic dielectric layers 123 and 124, the walls 126 of the opening being aligned such that the passivation layer 120 extends through the opening to contact regions of the contact pad 110 near the contact pad's peripheral edges 114.

In a particular embodiment, the passivation layer 120 includes an organic dielectric material such as a cross-linked polymer, especially polyimide. The passivation layer can include a composition of predominantly polyimide, or can include materials in addition to polyimide to form a composite layer such as polyimide glass. The passivation layer 120 functions as a barrier or solder mask for preventing solder from spreading over the external exposed surface of the microelectronic element.

Figure 2:
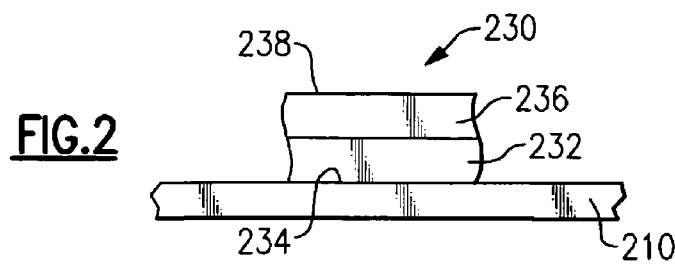
FIG. 2 is a partial sectional view illustrating additional details of a BLM structure included in a microelectronic element in accordance with a preferred embodiment of the invention.

FIG. 2 is a partial sectional view illustrating a layered stack of metals which make up an under bump metallization ("UBM") or BLM 230 in accordance with a preferred embodiment of the invention. The BLM includes at least two metal layers having different compositions, the first or lower metal layer 232 including a metal which promotes adhesion to the copper-containing contact pad 210 to which it is joined at a lower surface 234 of the lower metal layer 232. A second metal layer 236 overlies the first metal layer as a layer for forming a metallurgical bond with the fusible material of the bump, e.g., solder, tin, or eutectic material therein. The second metal layer 236 must be capable of forming a strong bond with the fusible material of the bump and be capable of withstanding temperatures at which the substrate is bonded to another microelectronic element.

In certain applications, substrates reach high temperatures during operation. For that reason, in such applications, bump interconnections in accordance with C4 technology utilize high melting temperature solder. Copper has a higher melting temperature than other metals such as tin and gold. In the embodiment illustrated in FIG. 1, the upper layer 236 of the BLM preferably consists essentially of copper. Preferably, copper is exposed at a surface 238 of the upper layer 236 to which a bump will be metallurgically joined, the copper providing a layer which performs well under many conditions including high temperature operating conditions.

For the lower layer 232 of the BLM, an alloy including titanium and nickel is provided. Titanium promotes adhesion between the BLM and the copper contact pad and the nickel content improves the function of the BLM as a barrier against diffusion of metals, especially the diffusion of copper away from the contact pad 210 and the diffusion of metals included in the bump towards the copper contact pad 210. However, preferably, the amount of nickel contained in the BLM is a relatively small percentage. Preferably, the amount of nickel is between 0.1 per cent and 5 per cent by weight. For some applications, the amount by weight of nickel within the lower layer 232 can be as high as 30%. However, certain applications may require a somewhat smaller or greater percentage by weight of nickel. In addition to titanium and nickel, the composition of the lower layer may also include tungsten.

Figure 3:
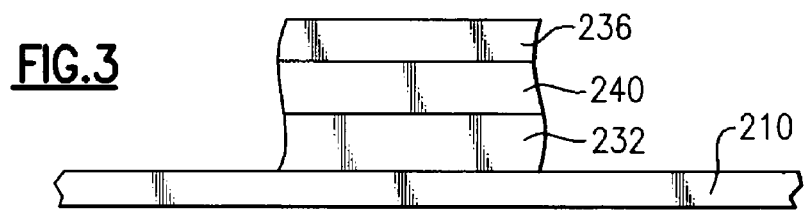
FIG. 3 is a partial sectional view illustrating additional details of a BLM structure included in a microelectronic element in accordance with a further preferred embodiment of the invention.

As further illustrated in FIG. 3, a UBM or BLM in accordance with another embodiment of the invention includes a middle layer 240 disposed between the upper layer 236 and the lower layer 232 metallurgically bonded to the contact pad 210. In one embodiment, the middle layer consists essentially of titanium, or consists essentially of nickel. Alternatively, the middle layer can consist essentially of an alloy of titanium and nickel. In another embodiment, the middle layer 240 consists essentially of an alloy including chromium and copper. In yet another embodiment, the middle layer 240 consists essentially of an alloy including titanium and tungsten.

Figure 4:
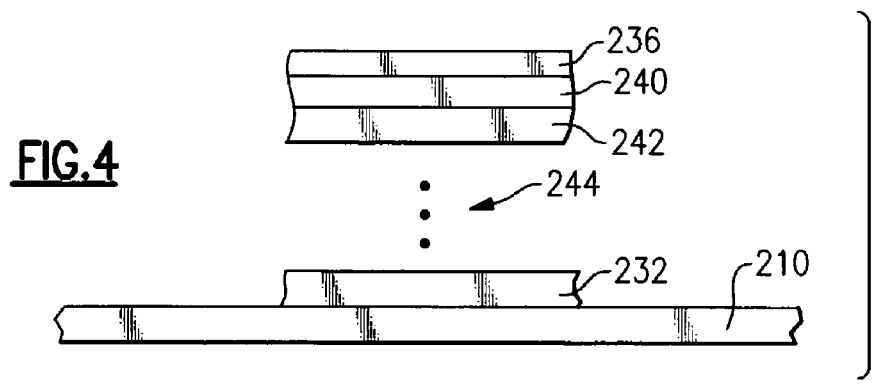
FIG. 4 is a further partial sectional view illustrating additional details of a BLM structure included in a microelectronic element in accordance with a particular preferred embodiment of the invention.

In a variation of the above-described embodiment of the invention as illustrated in FIG. 4, the BLM includes a plurality of middle layers 240, 242, 244, etc., which are successively layered one over another from the lower layer 232 to the upper layer 236. In one preferred embodiment, a BLM includes a layered stack of metals having a structure as follows: a lower layer consisting essentially of titanium and nickel in which the percentage amount by weight of nickel is between about 0.1 percent and 5 percent. A first middle layer overlies the lower layer and consists essentially of an alloy of titanium and tungsten. A second middle layer overlies the first middle layer and consists essentially of titanium. A third middle layer overlies the second middle layer, the third middle layer consisting essentially of nickel and the upper layer overlying the third middle layer, the upper layer consisting essentially of copper. In this preferred embodiment, the first middle layer preferably directly contacts the lower layer, the second middle layer preferably directly contacts the first middle layer, the third middle layer preferably directly contacts the second middle layer, and the upper layer preferably directly contacts the third middle layer.

In addition to the embodiments described above, microelectronic elements according to other particular preferred embodiments of the invention can include UBMs or BLMs in which the layered stack has one of the following compositions:

An embodiment where the layered stack includes (from the lowest layer contacting the copper pad to the highest layer which is exposed for contact with a fusible metal): a lowest layer having a composition including TiW—Ni and a thickness of between about 0.02 µm (200 angstroms) to about 0.25 µm (2500 angstroms)/a middle layer including CrCu and having a thickness of between about 0.3 µm (3000 angstroms) and about 6 µm (60,000 angstroms)/and a highest layer including Cu having a thickness of between about 0.1 µm (1000 angstroms) and 0.5 µm (5000 angstroms), where the lowest layer has a composition including Ni ranging between about 0.1 and 5 percent by weight, and TiW making up the rest. In the examples which follow, the individual lowest layer, middle layer and highest layer in each layered stack have comparable thicknesses.

2) An embodiment where the layered stack includes (from the lowest layer contacting the copper pad to the highest layer which is exposed for contact with a fusible metal): TiW—Ni/Ti/Cu, where the lowest layer has a composition including Ni ranging between about 0.1 and 5 percent by weight, and TiW making up the rest.

3) An embodiment where the layered stack includes (from the lowest layer contacting the copper pad to the highest layer which is exposed for contact with a fusible metal): TiW—Ni/Ni/Cu, where the lowest layer has a composition including Ni ranging between about 0.1 and 5 percent by weight, and TiW making up the rest.

4) An embodiment where the layered stack includes (from the lowest layer contacting the copper pad to the highest layer which is exposed for contact with a fusible metal): TiW—Ni/Ti/Ni/Cu, where the lowest layer has a composition including Ni ranging between about 0.1 and 5 percent by weight, and TiW making up the rest.

5) An embodiment where the layered stack includes (from the lowest layer contacting the copper pad to the highest layer which is exposed for contact with a fusible metal): a lowest layer including TiW—Ni/a middle layer including NiTi/and an upper layer of Cu overlying the intermediate layer, where the lowest layer has a composition including Ni ranging between about 0.1 and 5 percent by weight and TiW making up the rest of the lowest layer, and the middle layer has a composition including Ni ranging between about 0.1 and 99.9 percent by weight.

6) An embodiment where the layered stack includes (from the lowest layer contacting the copper pad to the highest layer which is exposed for contact with a fusible metal): TiW—Ni/Cu. In this embodiment, the intermediate layer or middle layer is not required since the Ti or Ni provided in the lower layer interlocks with the copper provided in the upper layer. Again the composition of the lower layer includes Ni ranging between about 0.1 and 5 percent by weight, with TiW making up the rest of the composition.

7) An embodiment where the layered stack includes (from the lowest layer contacting the copper pad to the highest layer which is exposed for contact with a fusible metal): Ti—Ni/Cu. Again, in this embodiment, the intermediate layer or middle layer is not required since the Ti or Ni provided in the lower layer interlocks with the copper provided in the upper layer. Again the composition of the lower layer includes Ni ranging between about 0.1 and 5 percent by weight, with Ti making up the rest of the composition.

8) An embodiment where the layered stack includes (from the lowest layer contacting the copper pad to the highest layer which is exposed for contact with a fusible metal): TiNi/TiW/CrCu/Cu. Again the composition of the lower layer includes Ni ranging between about 0.1 and 5 percent by weight, with Ti making up the rest of the composition.

9) An embodiment where the layered stack includes (from the lowest layer contacting the copper pad to the highest layer which is exposed for contact with a fusible metal): TiNi/TiW/Ti/Cu. Again the composition of the lower layer includes Ni ranging between about 0.1 and 5 percent by weight, with Ti making up the rest of the composition.

10) An embodiment where the layered stack includes (from the lowest layer contacting the copper pad to the highest layer which is exposed for contact with a fusible metal): TiNi/TiW/Ni/Cu. The composition of the lower layer includes Ni ranging between about 0.1 and 5 percent by weight, with Ti making up the rest of the composition.

11) An embodiment where the layered stack includes (from the lowest layer contacting the copper pad to the highest layer which is exposed for contact with a fusible metal): TiNi/TiW/Ti/Ni/Cu. The composition of the lower layer includes Ni ranging between about 0.1 and 5 percent by weight, with Ti making up the rest of the composition.

The respective layers in the above-described embodiments may be deposited using a sputtering system. Additionally, sequential sputtering followed by annealing at appropriate conditions may also be employed.

Figure 5:
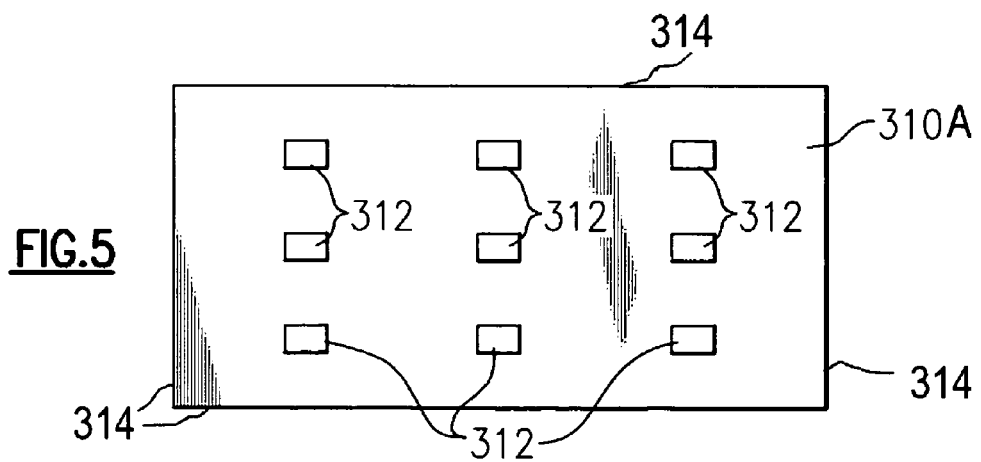
FIG. 5 is a top-down plan view illustrating a contact surface of a cheesed contact pad of a microelectronic element in accordance with an embodiment of the invention.

FIG. 5 illustrates a copper pad of a microelectronic element according to a variation of the above embodiments in which the copper pad 310 of the substrate contacted by the BLM or UBM is a continuous pad having a contact surface 310A and a plurality of openings 312 spaced apart from peripheral boundaries 314 of the contact surface in which a dielectric fills the openings to provide a "cheesed pad" structure. A BLM or UBM provided in accordance with any of the above-described embodiments can be provided as a layered stack contacting the contact surface of either a uniformly copper pad or a cheesed copper pad 310 as illustrated in FIG. 5.

While the invention has been described in accordance with certain preferred embodiments thereof, many modifications and enhancements can be made thereto without departing from the true scope and spirit of the invention, which is limited only by the claims appended below.

What is claimed is:

1. A microelectronic element, comprising:
a continuous cheesed metal contact pad having a contact surface and including a plurality of dielectric-filled openings exposed at the contact surface and spaced apart from peripheral boundaries of the contact surface, the dielectric-filled openings surrounded in the plane of the contact surface by the metal of the contact pad, said contact pad having a composition including copper exposed at said contact surface;
a passivation layer overlying said major surface of said substrate, said passivation layer exposing at least a portion of said contact surface; and
an underbump metallization ("UBM") including a plurality of metal layers arranged in a stack overlying said contact surface and at least a portion of said passivation layer, said UBM including:
(a) a lower layer including an alloy including titanium (Ti) and nickel (Ni) in contact with said contact surface wherein a weight percentage of titanium in the alloy is substantially greater than a weight percentage of nickel in the alloy; and
(b) an upper layer overlying said lower layer, said upper layer consisting essentially of copper; and
a conductive bump including a fusible metal metallurgically bonded to the upper layer of the UBM.

2. The microelectronic element as claimed in claim 1, wherein said lower layer further comprises tungsten.

3. The microelectronic element as claimed in claim 1, wherein said lower layer has a composition including up to about five percent by weight of nickel.

4. The microelectronic element as claimed in claim 1, wherein said lower layer has a composition including about 90 percent by weight of tungsten.

5. The microelectronic element as claimed in claim 1, further comprising at least one middle layer disposed above said lower layer and below said upper layer, said middle layer including an alloy of titanium (Ti) and tungsten (W).

6. The microelectronic element as claimed in claim 1, wherein said middle layer has a composition ranging from 0.1 percent by weight Ni to 99.9 percent by weight Ni, wherein an amount of Ti in percent by weight makes up a balance of said composition.

7. The microelectronic element as claimed in claim 1, wherein said dielectric-filled openings are filled with a dielectric material consisting essentially of an oxide.

8. The microelectronic element as claimed in claim 1, wherein said substrate consists essentially of a single-crystal semiconductor material.

9. The microelectronic element as claimed in claim 1, wherein said fusible metal includes at least one of solder or tin.

10. The microelectronic element as claimed in claim 3, wherein said lower layer has a composition ranging from between 0.1 and 5 percent by weight of nickel.

11. The microelectronic element as claimed in claim 5, wherein said middle layer is a first middle layer, said microelectronic element further comprising at least one second middle layer disposed above said first middle layer and below said upper layer, said at least one second middle layer including at least one metal selected from the group consisting of titanium (Ti) and nickel (Ni).

12. The microelectronic element as claimed in claim 5, wherein said middle layer includes a plurality of layers.

13. The microelectronic element as claimed in claim 5, wherein said middle layer is a first middle layer, said microelectronic element further comprising at least one second middle layer disposed above said first middle layer and below said upper layer, said at least one second middle layer including an alloy, said alloy including chromium (Cr) and copper (Cu).

14. The microelectronic element as claimed in claim 10, wherein said lower layer further includes tungsten (W) and said microelectronic element further comprises at least one middle layer disposed above said lower layer and below said upper layer, said at least one middle layer including at least one metal selected from the group consisting of titanium (Ti) and nickel (Ni).

15. The microelectronic element as claimed in claim 10, wherein said lower layer further includes tungsten (W) and said microelectronic element further comprises at least one middle layer disposed above said lower layer and below said upper layer, said at least one middle layer including an alloy, said alloy including chromium (Cr) and copper (Cu).

* * * * *